(12) United States Patent
Park et al.

(10) Patent No.: US 7,432,552 B2
(45) Date of Patent: Oct. 7, 2008

(54) BODY BIASING STRUCTURE OF SOI

(75) Inventors: Byung-Gook Park, Seoul (KR); Tae-Hoon Kim, Seoul (KR); Il-Han Park, Gyeonggi-do (KR)

(73) Assignees: Seoul National University Industry Foundation, Seoul (KR); Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/423,696

(22) Filed: Jun. 12, 2006

(65) Prior Publication Data

US 2006/0278927 A1  Dec. 14, 2006

(30) Foreign Application Priority Data

Jun. 11, 2005 (KR) .................. 10-2005-0050107

(51) Int. Cl.
*H01L 27/01* (2006.01)
(52) U.S. Cl. ....................... 257/349; 257/347
(58) Field of Classification Search .................. 257/347, 257/348, 349
See application file for complete search history.

(56) References Cited

U.S. PATENT DOCUMENTS

| | | | |
|---|---|---|---|
| 5,587,604 A | 12/1996 | Machesney et al. | |
| 6,249,027 B1 | 6/2001 | Burr | |
| 6,414,353 B2* | 7/2002 | Maeda et al. | 257/347 |
| 6,624,459 B1* | 9/2003 | Dachtera et al. | 257/296 |
| 6,774,016 B2 | 8/2004 | Jang | |

FOREIGN PATENT DOCUMENTS

| | | |
|---|---|---|
| KR | 10 2005 0005304 | 1/2005 |
| KR | 100603721 | 7/2006 |
| WO | WO 01/43186 | 6/2001 |

OTHER PUBLICATIONS

Weste, Neil H. E. & Eshraghian, Kamran, "Principles of CMOS VLSI Design: A systems perspective," Second Edition, AT&T, 1993, 5 pages.

* cited by examiner

*Primary Examiner*—Richard T. Elms
*Assistant Examiner*—Allison P Bernstein
(74) *Attorney, Agent, or Firm*—Marger Johnson & McCollom PC

(57) ABSTRACT

A body biasing structure of devices connected in series on an SOI substrate is provided. According to some embodiments, the shallow junction of common source/drain regions enables all devices to bias by only one body contact on an SOI substrate like a conventional bulk MOSFET, and the floating body effect on an SOI substrate can be prevented.

9 Claims, 20 Drawing Sheets

Drain Voltage [V]

BODY BIASING STRUCTURE OF SOI

CROSS REFERENCE TO RELATED APPLICATION

This application claims priority under 35 U.S.C. § 119 of Korean Patent Application 2005-0050107, filed on Jun. 11, 2005, the entire contents of which are hereby incorporated by reference.

BACKGROUND

1. Technical Field

The present invention relates to a body biasing structure for SOI (Silicon-On-Insulator) devices, and more specifically to a body biasing structure of devices connected in series on an SOI substrate.

2. Description of Related Art

SOI technology, which consists of forming a single-crystal-silicon layer on an insulator layer and then forming devices on the silicon layer, has been utilized recently to cope with increasing demands for faster, less power consuming and more highly integrated semiconductor integrated circuits.

SOI technology can decrease the electrical resistance between devices and increase their heat efficiency, and it is useful for high-speed semiconductor devices with small electrical power consumption. Also, it is possible to speed up a device more than 30% and decrease the amount of electrical power consumption of the device about 30%. Further, it is easier to realize System on Chip (SoC) technology because electrical isolation between devices is easier.

Therefore, research has been actively proceeding on memory devices using an SOI substrate.

FIG. 1 is the structure of a conventional MOSFET fabricated on an SOI substrate. The SOI MOSFET includes a buried oxide layer 11), a source region 22, a drain region 24, a body region 26, a gate insulating layer 30, and a gate 40. The supporting substrate for the SOI device is not shown.

An SOI MOSFET, in a conventional operating condition, can be divided into two cases. In the first case, the silicon body of FIG. 1 is fully depleted Full Depletion, hereinafter referred to as 'FD') and in the other case, the silicon body is partially depleted (Partial Depletion, hereinafter referred to as 'PD'). In each case, the SOI MOSFET exhibits different operating characteristics.

For convenience, only an SOI nMOSFET device is described in detail herein. However, an SOI MOSFFT device can be understood the same way except for replacing "n-type" and "electron" with "p-type" and "hole" respectively.

Although a device on an SOI substrate has many strong points as mentioned before, it also has a weak point during operation because the source region 22 and the drain region 24 make the silicon body 26 float electrically, as shown in FIG. 1.

That is, in a conventional bulk MOSFET, when too high of a voltage is applied to the drain region 24, holes generated by an ionized collision from the drain region 24 can escape through the substrate. But in an SOI MOSFET, the holes can not escape through the substrate due to the floating body 26, so the holes must escape through the source region 22. As a result, the holes that have not escaped become accumulated on the floating body 26 near the source region 22. This increases the electric potential of the floating body 26, and the increased electric potential decreases the threshold voltage and triggers a kink effect. The kink effect is shown by a sudden rise in drain current even before the breakdown voltage is reached. Kink effects are more prevalent in the PD structure than in the FD structure. This results from the fact that in the PD structure, the electric potential of the floating body region 26 is relatively lower than that of the depletion region, and holes are held in the body region, while in the FD structure, the distribution of electric potential at the depletion region makes holes escape easily toward the source region 22.

FIGS. 2a, 2b and 2c show simulation results comparing the operational characteristics of the SOI nMOSFET with the conventional bulk nMOSFET under the same manufacturing conditions. FIG. 2a is a graph illustrating the electrical characteristics $I_D$-$V_D$ ($V_G$=1.1~7.7V, step=1.1V) of the conventional bulk nMOSFET. FIG. 2b shows the kink effect (VG=1.1~3.3V, step=1.1V) of the SOI nMOSFET, and FIG. 2c is a graph illustrating the electrical characteristics $I_D$-$V_D$ ($V_G$=1.1~7.7V, step=1.1V) of the SOI nMOSFET.

As mentioned above, the effect of hole accumulation on the device features can be not only the kink effect (as shown in FIG. 2b) but also a decrease in the drain breakdown voltage (as shown in FIG. 2c). Due to the floating body effect, the electric potential of the body can rise more easily than in the conventional bulk MOSFET, and this accelerates the undesired operation as a parasitic bipolar junction transistor when the junction between the source region and the body region is biased more forwardly.

In the FD structure, it is advantageous that kink effects are smaller than in the PD structure. However, at a high drain voltage, similar to the PD structure, hole accumulation at the depletion region adjacent to the source region causes a lower drain voltage.

Therefore, it is most important to suppress the floating body effect as described above by body biasing in the SOI technology.

Body biasing is achieved in one conventional method as shown in FIG. 3. Poly-silicon has been patterned as a gate over a P-type silicon active region. N⁺ and P⁺ ions have been injected, a contact has been made on the silicon region injected with P⁺ ions, and a bias has been added there. Through the silicon active region under the poly-silicon, an active region, which can be a channel for operating a device, has been biased.

However, according to the conventional method, in order to bias along with an active region under a gate, it has been necessary to define an active region along with a gate line up to a region, at which a contact can be formed, and it is difficult to define an arranged active region under a gate line accurately when the width of the gate line is narrow. Moreover, in a case where many devices are connected in series, there is a need to body bias all devices, and so this has been a disadvantage for increasing device integration.

Especially susceptible to these problems are various series circuits of devices, which have a source/drain in common. Typical examples of series circuits are NAND gates and NOR-gates, which are fundamental in digital logic circuits, and NAND type flash memories, which have gained popularity as information storing devices in conjunction with a sudden increase in consumption of multi-media instruments, etc. In a NAND gate circuit, nMOSFETs are connected in series, and in a NOR gate circuit, pMOSFETs are connected in series. In a NAND type flash memory, usually 8 to 32 nMOSFET type memory cells are connected in series.

To suppress the floating body effect, there have been various methods attempted, such as forming an SOI device at a full depletion layer, forming a back-channel gate, connecting an SOI body to a silicon supportive substrate, forming a hetero junction, and so on. Each method has had its own problems; in a method for forming an SOI device at a full depletion layer, there was a limitation on the thickness of the silicon layer on the SOI substrate, and the SOI device characteristics were so heavily dependent on the uniformity of the silicon layer that poor uniformity could cause malfunctions; in a method to form a back channel gate or to form a hetero junction, such particulars as the SOI structure, the arrangement of contacts, the resistance and so on, have to be taken into consideration, and there are problems with contacts when a channel is too broad or too short, and from a view of the process, it is difficult to embody the contact, which connects a SOI body to a silicon supportive substrate.

SUMMARY

To solve the problems associated with SOI devices, embodiments of the invention are directed to a new body biasing structure for SOI devices. The body biasing structure can suppress the floating body effect on an SOI substrate by making a junction of the common source/drain region shallow in various series circuits of devices, which have a source/drain in common, and making it possible to body bias several devices with only one body biasing contact.

BRIEF DESCRIPTION OF THE FIGURES

The invention may be better understood by the drawings that are briefly described below and attached hereto, in the several figures of which identical reference numbers (if any) refer to identical or similar elements.

FIGS. 4a-1 and 4a-2 illustrate intermediate structures formed upon performing certain processes used to form the array shown in FIG. 4a.

FIG. 4b is a graph illustrating the cross sectional view taken along line AA' in FIG. 4a.

FIG. 8b is a cross sectional view taken along line BB' in FIG. 8a.

DETAILED DESCRIPTION

A body biasing structure of some embodiments includes an SOI substrate; an active region, which is comprised, in the SOI substrate, of a body biasing contact region, a common active region connected to the body biasing contact region, and a device active region connected to the common active region; a field region, which defines the active region in the SOI substrate; a first conducting layer, which is formed on an insulating layer over both one part of the body biasing contact region and one part of the common active region; a second conducting layer, which is formed on an insulating layer over the device active region; a source region, which is formed in the other part of the common active region, over which the first conducting layer is not formed; a common source/drain region, which is formed between the first conducting layer and the second conducting layer; and a body region, which is formed in the active region, where the source region and the common source/drain region are not formed.

A detailed description of preferred embodiments of the body biasing structure in an SOI substrate is provided below with respect to the accompanying drawings.

In these drawings, the following reference numbers are used throughout: reference number 100 indicates a buried oxide layer (BOX), 220 means a source region, 240 means a common source/drain region, 260 means a body region, 300 means a gate insulating layer, 400 means a first conducting layer (common gate line), 500 means a second conducting layer (word line), 600 means a body biasing contact region, 700 means a common active region and 800 means a device active region.

Figure 4A:
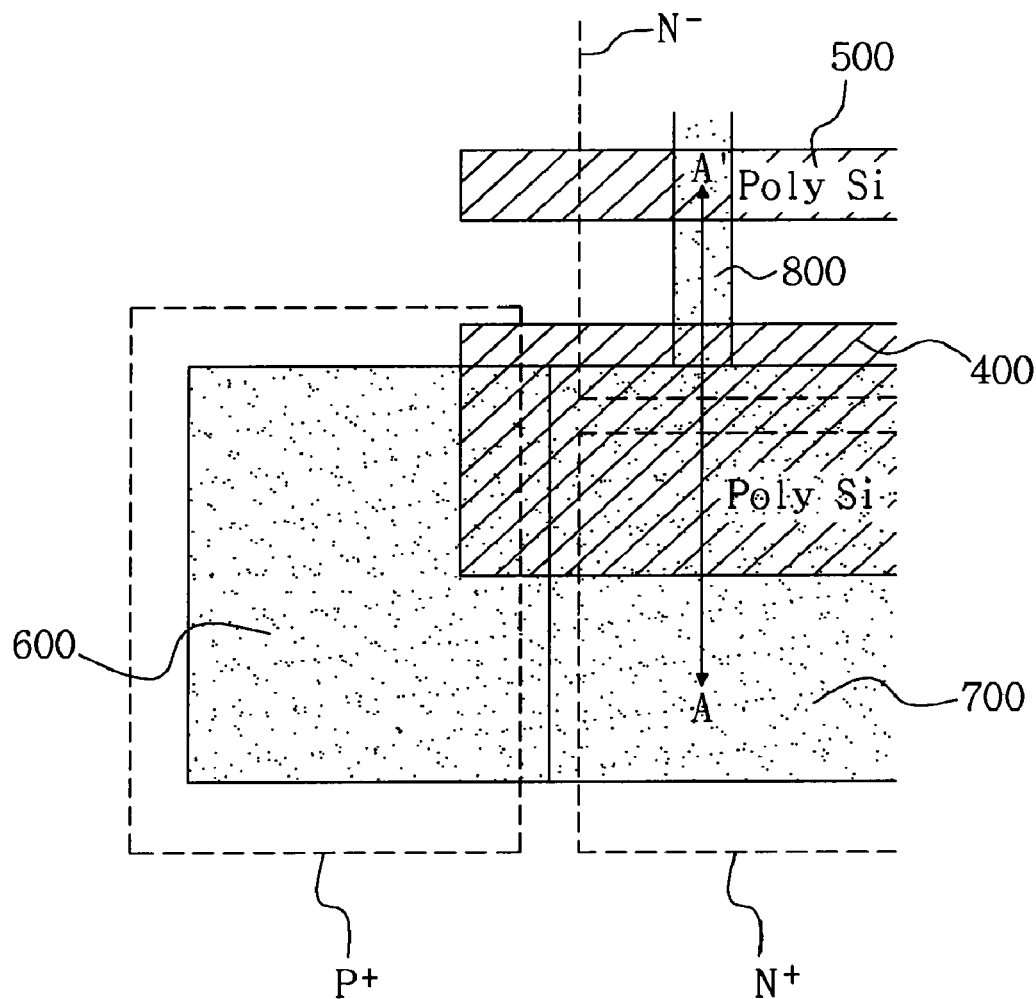
FIG. 4a illustrates an array, which makes it possible to body bias many devices connected in series in accordance with some embodiments.
Figures 1, 4A:
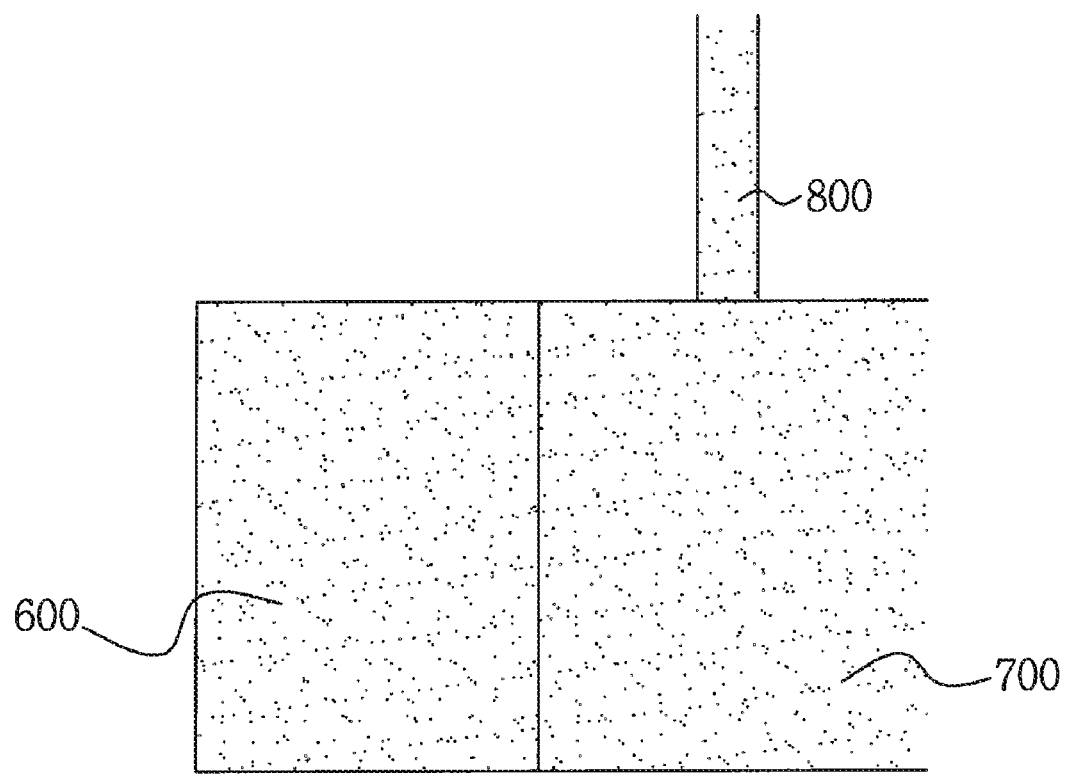
Figures 2, 4A:
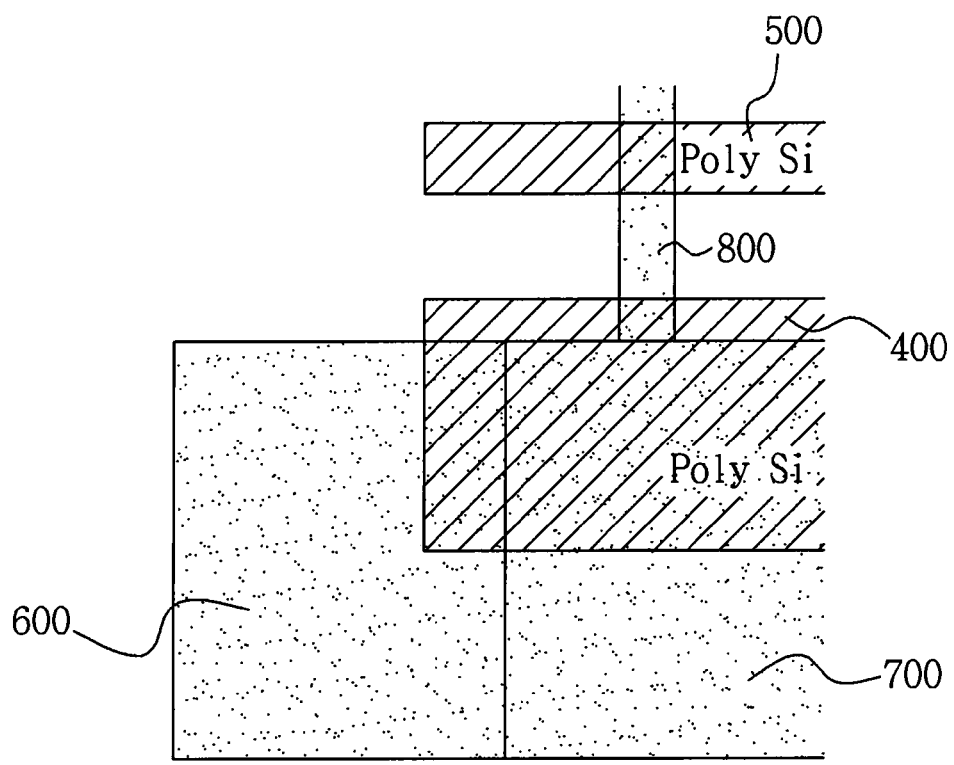
Figure 4B:
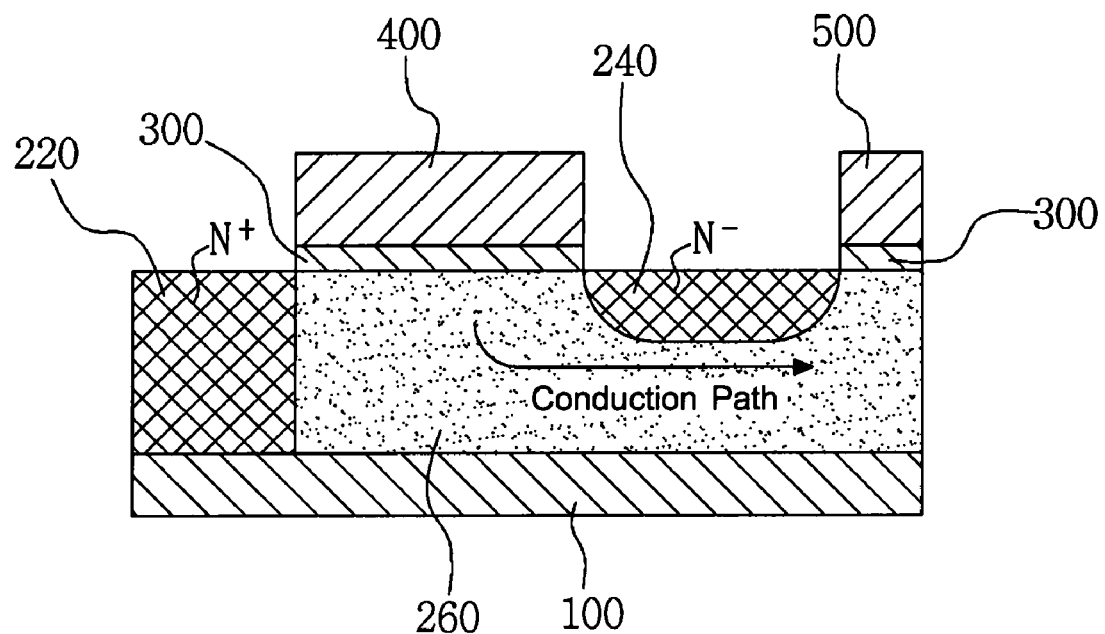

FIG. 4a illustrates an array, which makes it possible to body bias many devices connected in series in accordance with some embodiments. FIG. 4b is a graph illustrating the cross sectional view taken along line AA' in FIG. 4a.

As shown in FIGS. 4a, 4a-1, 4a-2 and 4b, a body biasing structure in an SOI substrate is formed by defining an active region, which is comprised of a body biasing contact region 600, a common active region 700 connected to the body biasing contact region and a device active region 800 connected to the common active region in the SOI substrate by a field region (FIG. 4a-1); forming a first conducting layer 400 and a second conducting layer 500 each on an insulating layer over the active region (FIG. 4a); and injecting P+, N+, and N− ions (FIG. 4a) using the first conducting layer 400 and the second conducting layer 500 as a mask to obtain a source region 220, a common source/drain region 240, and a body region 260 (FIG. 4b).

In this case, injecting $N^+$ ions is a process that makes the junction relatively deep and injecting $N^-$ ions is a process that makes the junction relatively shallow. Therefore, as shown in FIG. 4b, by making the junction of a common source/drain region shallow, a conduction path can be formed under the junction.

Forming a body biasing structure for several series devices includes pulling out a silicon active body region 260 under a gate 400 of the last device, which is required to form a contact among devices connected in series, and forming a body biasing contact region 600 to do a body contact by injecting P+ ions as shown in FIG. 4a; thereby body biasing through the body biasing contact region can bias the bodies of all the devices connected in series at the same time through the conduction path under the gate of the last device and under a junction of common source/drain regions. Naturally, a common source contact is formed on a predetermined place of a common active region 700 in N+ region.

Figure 5A:
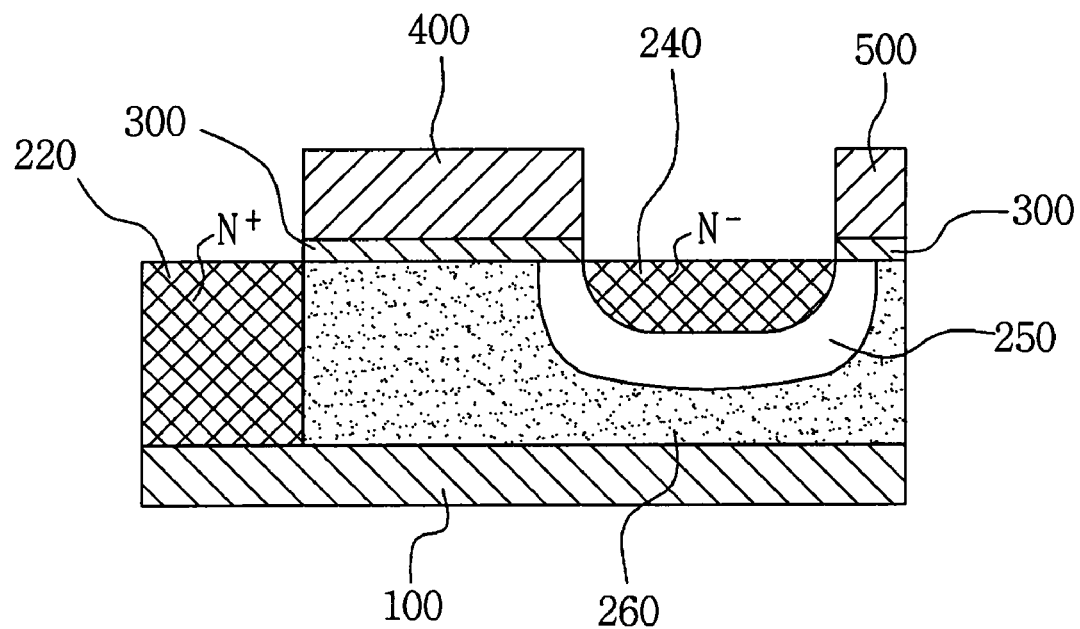
FIG. 5a is a graph illustrating the cross sectional view taken along line AA' in FIG. 4a, showing the case in which a depletion layer is formed under a common source/drain region which does not block a conduction path in accordance with some embodiments.
Figure 5B:
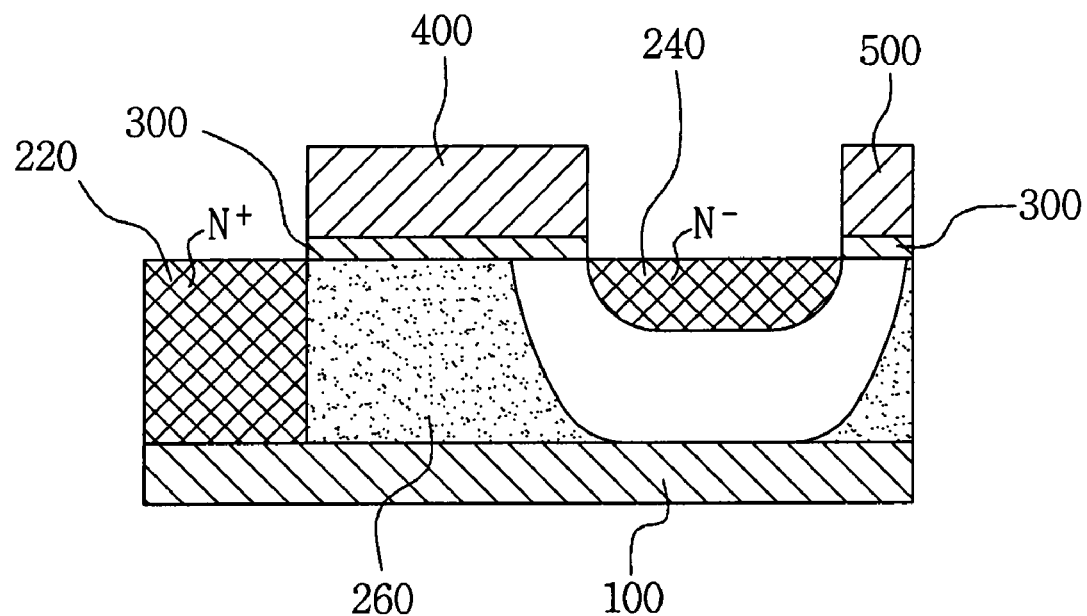
FIG. 5b is a graph illustrating the cross sectional view taken along line AA' in FIG. 4a, and this shows the case that a depletion layer formed under a common source/drain region of the present invention blocks a conduction path according to some embodiments.

FIG. 5a is a graph illustrating the cross sectional view taken along line AA' in FIG. 4a, showing the case in which a depletion layer is formed under a common source/drain region which does not block a conduction path in accordance with some embodiments. FIG. 5b is a graph illustrating the cross sectional view taken along line AA' in FIG. 4a, and this shows the case that a depletion layer formed under a common source/drain region of the present invention blocks a conduction path according to some embodiments.

During operation, a depletion layer 250 is formed under a junction of a common source/drain region 240 as shown in FIG. 5a, and this depletion layer 250 can block the conduction path as shown in FIG. 5b, when the depletion layer is thicker than the silicon active region. However, under this circumstance, the simulation results show that the present invention provides superior breakdown voltage characteristics to a conventional SOI MOSFET, of which the body is floated.

Figure 6A:
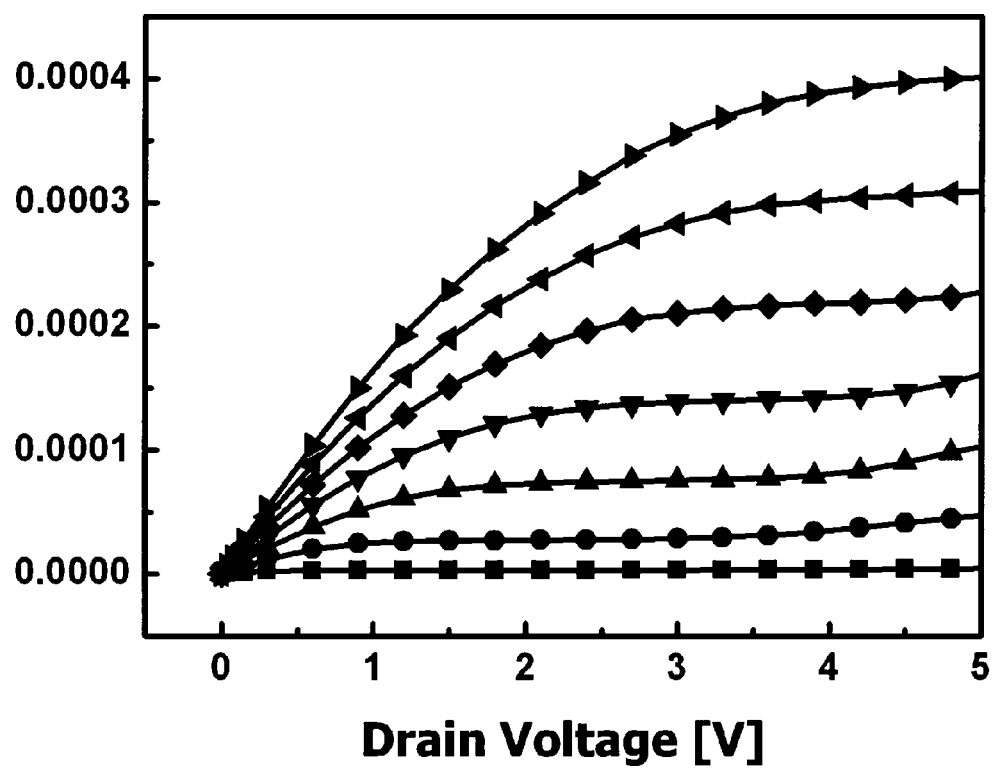
FIG. 6a is a graph illustrating the electrical characteristics $I_D$-$V_D$ in the case that a depletion layer does not block a conduction path according to some embodiments.
Figure 6B:
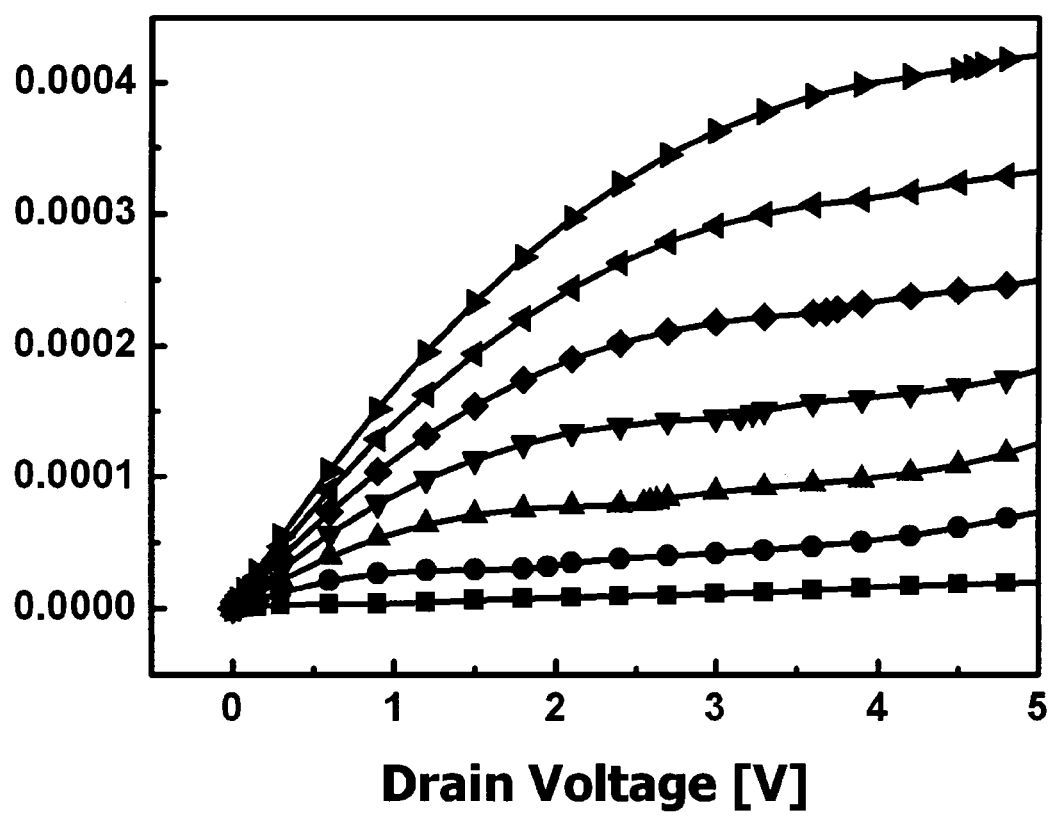
FIG. 6b is a graph illustrating the electrical characteristics $I_D$-$V_D$ in the case that a depletion layer blocks a conduction path according to some embodiments.

FIG. 6a is a graph illustrating the electrical characteristics $I_D$-$V_D$ in the case that a depletion layer does not block a conduction path according to some embodiments. FIG. 6b is a graph illustrating the electrical characteristics $I_D$-$V_D$ in the case that a depletion layer blocks a conduction path according to some embodiments.

Figure 1:
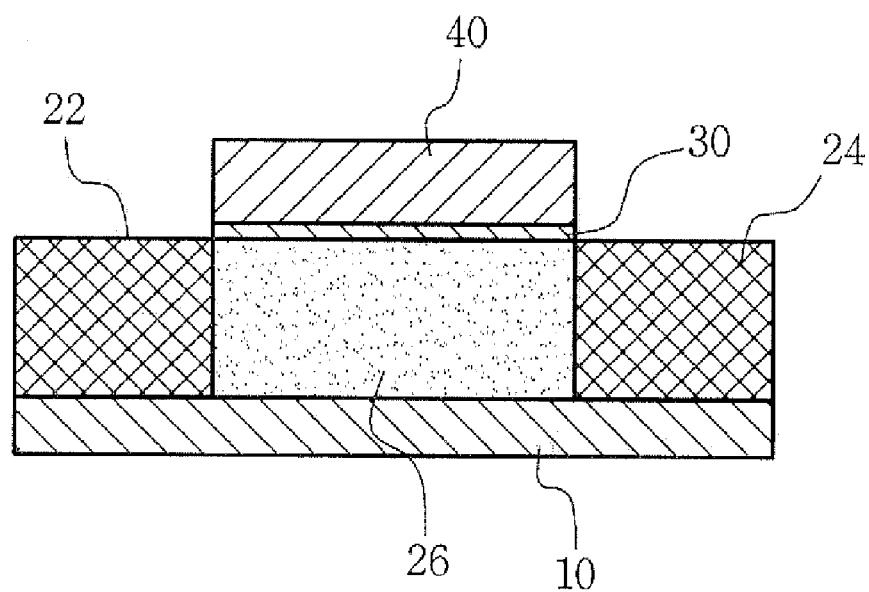
FIG. 1 is a cross sectional view of the conventional structure of a MOSFET on an SOI substrate.
Figure 2A:
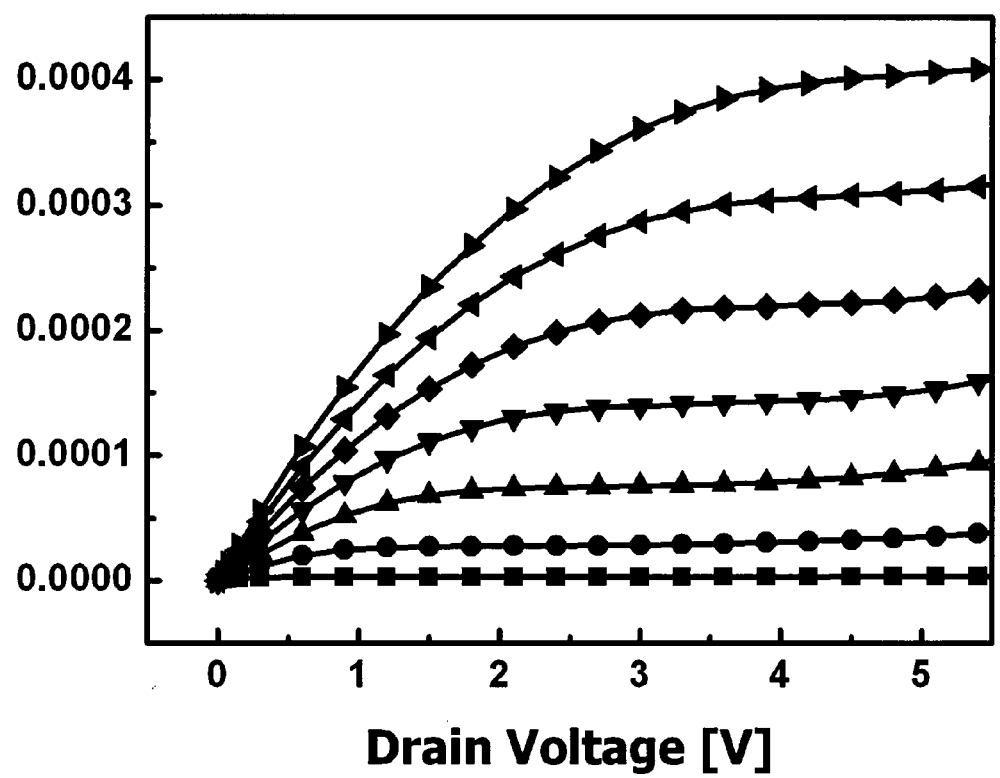
FIG. 2a is a graph illustrating the electrical characteristics $I_D$-$V_D$ of a conventional bulk nMOSFET.
Figure 2B:
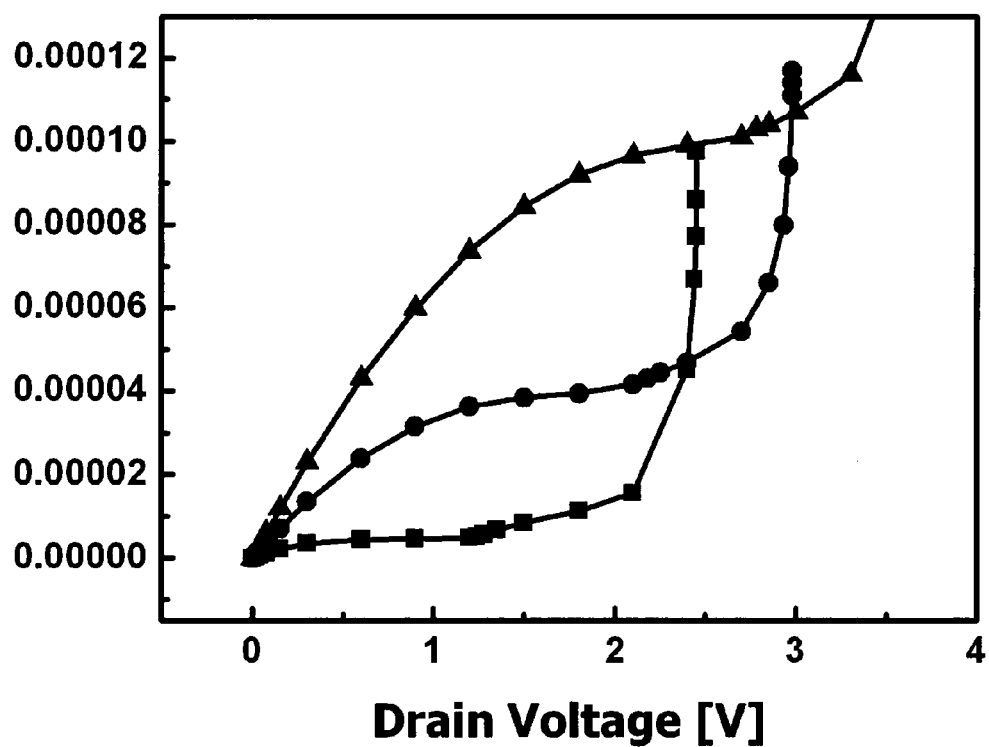
FIG. 2b is a graph illustrating the electrical characteristics, which shows the kink effect, of an nMOSFET on an SOI substrate.
Figure 2C:
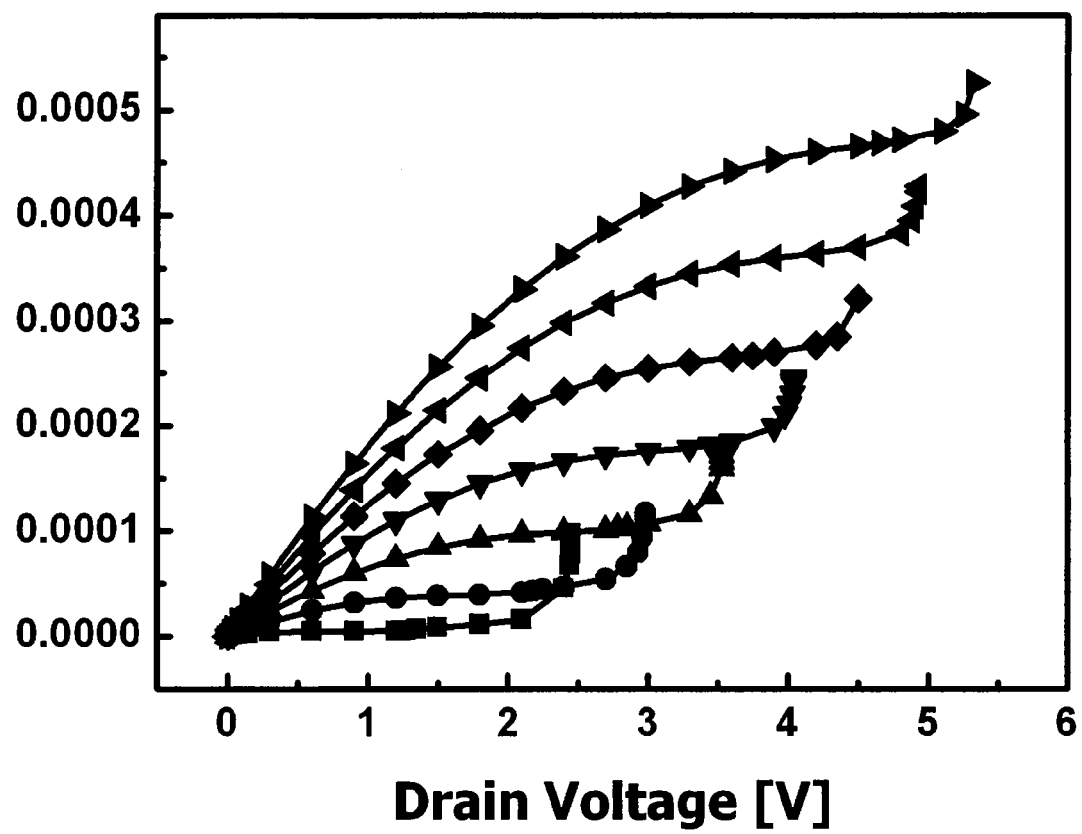
FIG. 2c is a graph illustrating the electrical characteristics $I_D$-$V_D$ of an nMOSFET on an SOI substrate.
Figure 3:
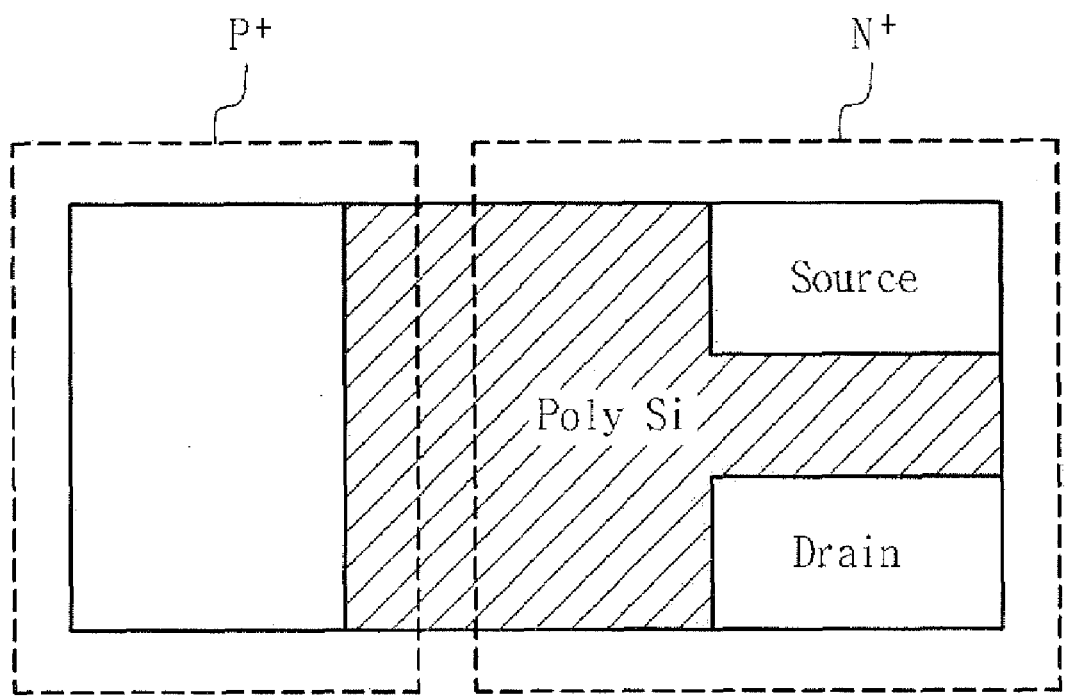
FIG. 3 illustrates a body biasing structure of a conventional nMOSFET on an SOI substrate.

Referring to FIGS. 6a and 6b, the figures show that even a PD structure, in which a kink effect or a breakdown voltage characteristic is relatively poor, provides an excellent electrical characteristic improvement over a conventional structure. That is, when a depletion layer does not block the conduction path (FIG. 6a), a breakdown voltage characteristic is as good as a bulk device, and even when a depletion layer blocks the conduction path (FIG. 6b), though a slight kink effect appears, an incomparably better breakdown voltage characteristic can de obtained than in case of the floated body (FIG. 2c).

Figure 6C:
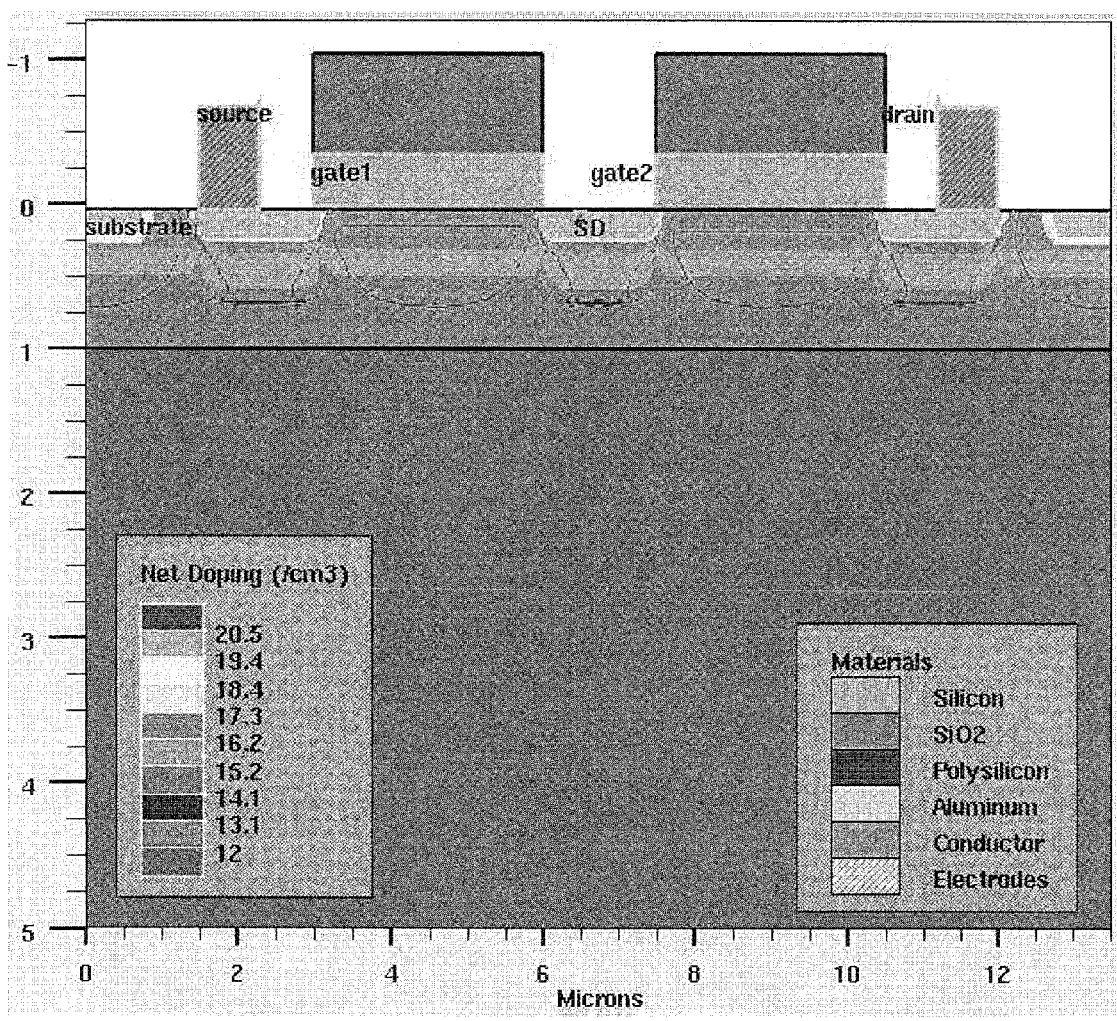
FIG. 6c illustrates a device array in the case that a depletion layer blocks a conduction path according to some embodiments.
Figure 6D:
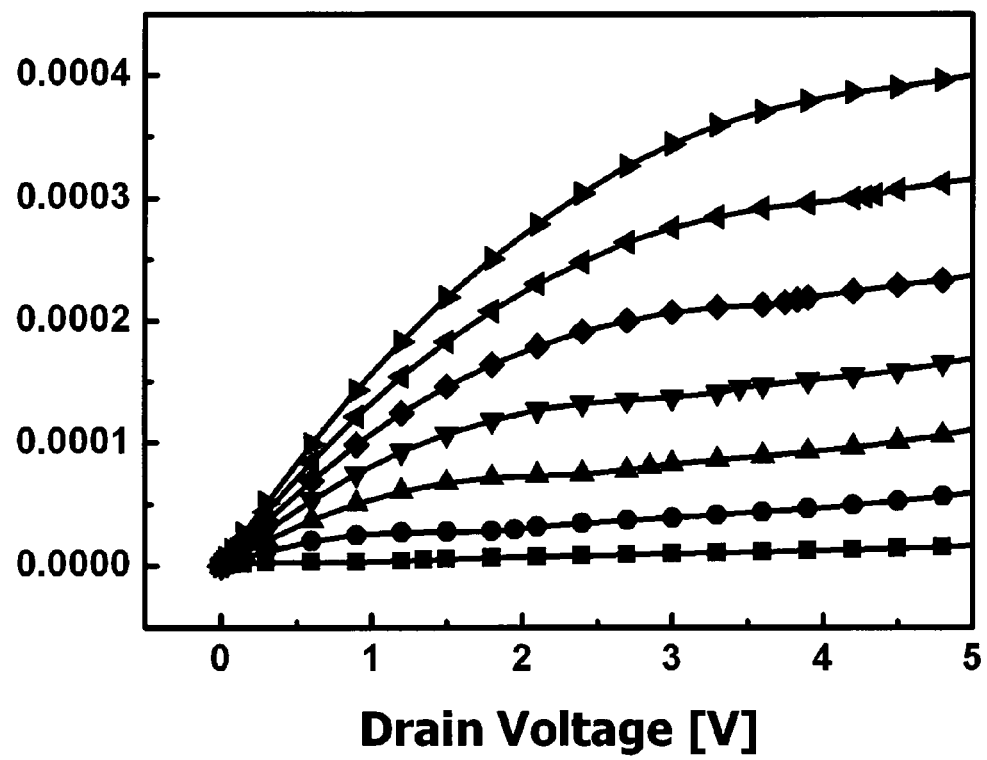
FIG. 6d is a graph illustrating the electrical characteristics $I_D$-$V_D$ for the right device in the array FIG. 6c.

FIG. 6c illustrates a device array in the case that a depletion layer blocks a conduction path according to some embodiments. FIG. 6d is a graph illustrating the electrical characteristics $I_D$-$V_D$ for the right device in the array FIG. 6c.

In order to investigate the degree of characteristic improvements between devices at a distance in series, a structure is simulated. FIG. 6c illustrates the simulated structure, in which a depletion layer blocks a conduction path and a region under a gate is partially depleted. The right one of the two devices, which is separated from a body contact, shows a characteristic of FIG. 6d, and it also shows an incomparably better breakdown voltage characteristic than that of a conventional structure, of which the body is floated.

According to some embodiments, the depth of a depletion layer under a junction of a common source/drain region 240 does not matter. For example, a NAND type flash memory on an SOI substrate would be in accordance with these embodiments.

A common flash memory can be classified as NOR or NAND type, according to its array organization of unit cells. In a NOR type flash memory, the speed of programming is rapid due to a CHE injection program mechanism, and the random access characteristic is excellent due to the cell array structure. However, NOR devices are less suited for applications requiring a high degree of integration. Therefore, a NOR type flash memory can be utilized in a field which requires rapid random access.

On the contrary, in a NAND type flash memory, the speed of programming is slow due to an F-N tunneling mechanism, and the random access characteristic is not good. However, NAND device is better suited for a high degree of integration. So, a NAND type flash memory is economically superior to a NOR type flash memory array. As an example, a NAND type flash memory can be utilized in recording devices suitable for large amounts of information, in which the random access time is not as important.

In a NAND type flash memory, a block erase operation, erasing all blocks, of which many devices comprise one block, is used to improve the erasing characteristic, and body biasing is necessary for the block erase operation. While manufacturing a NAND type flash memory on an SOI substrate, it is difficult to bias the bodies of all the memory devices at the same time, because the silicon in the regions where devices are not formed is etched. However, body biasing can be accomplished according to some embodiments of the invention.

Figure 7:
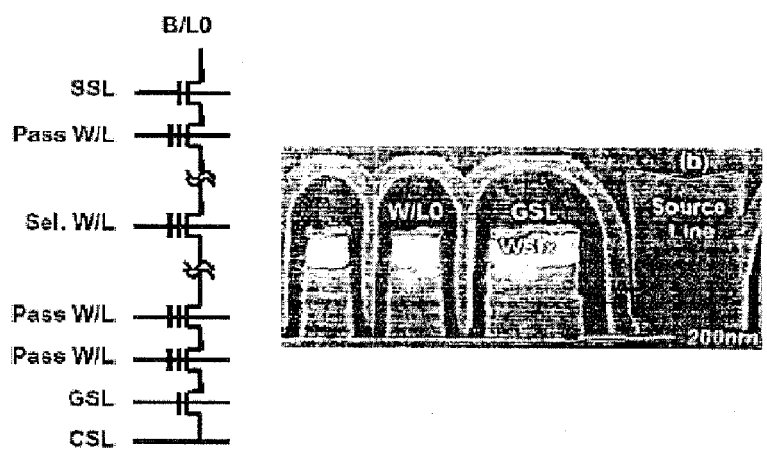
FIG. 7 illustrates a conventional NAND flash memory array and a cross sectional photograph of a typical array.
Figure 8A:
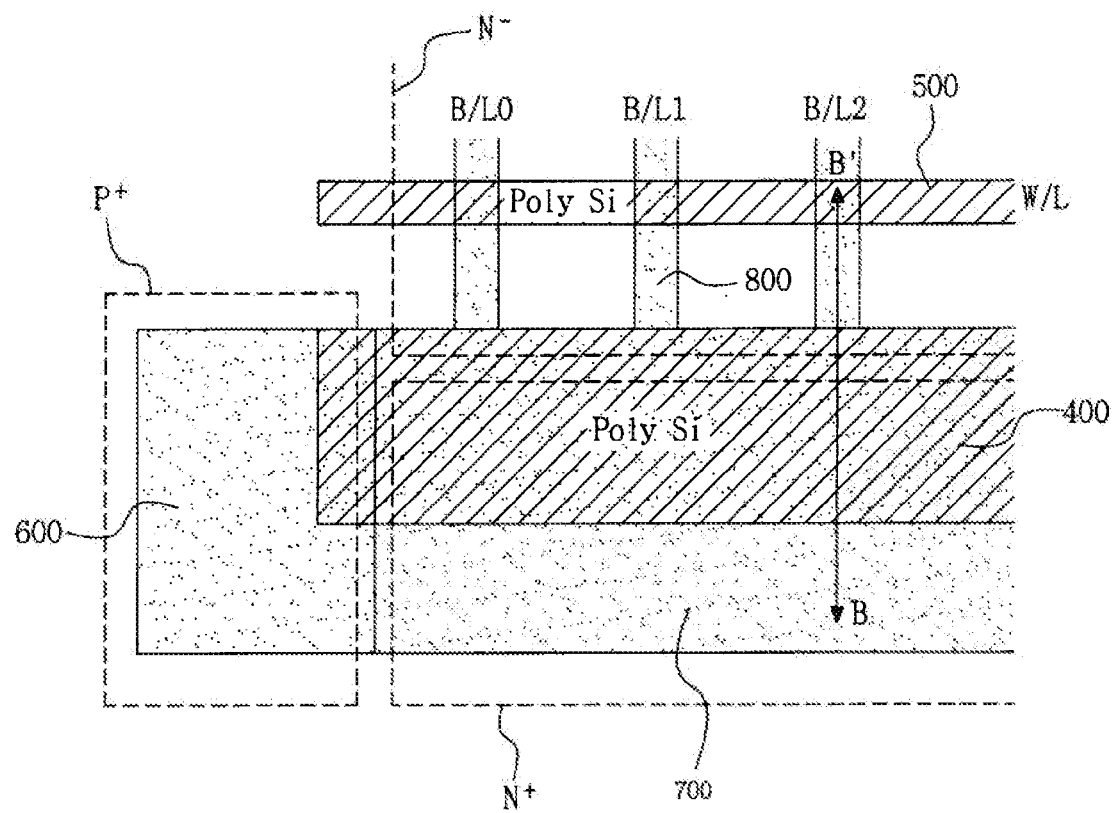
FIG. 8a illustrates a body biasing structure of a NAND type flash memory array according to some embodiments.

FIG. 7 illustrates a conventional NAND flash memory array and a cross sectional photograph of a typical array. FIG. 8a illustrates a body biasing structure of a NAND type flash memory array according to some embodiments FIG. 8b is a cross sectional view taken along line BB' in FIG. 8a.

Referring to FIGS. 7 and 8a, in a NAND type flash memory, there are selective transistors on both sides of a cell array in addition to a memory unit cell. Body biasing can be accomplished by making a junction of a common source/drain region of memory unit cells appropriately deep, making it possible to bias under the region, and embodying a NAND type flash memory array structure as shown in FIG. 8a with selective transistors, of which the effect of their scaling on integration is relatively small.

Figure 8B:
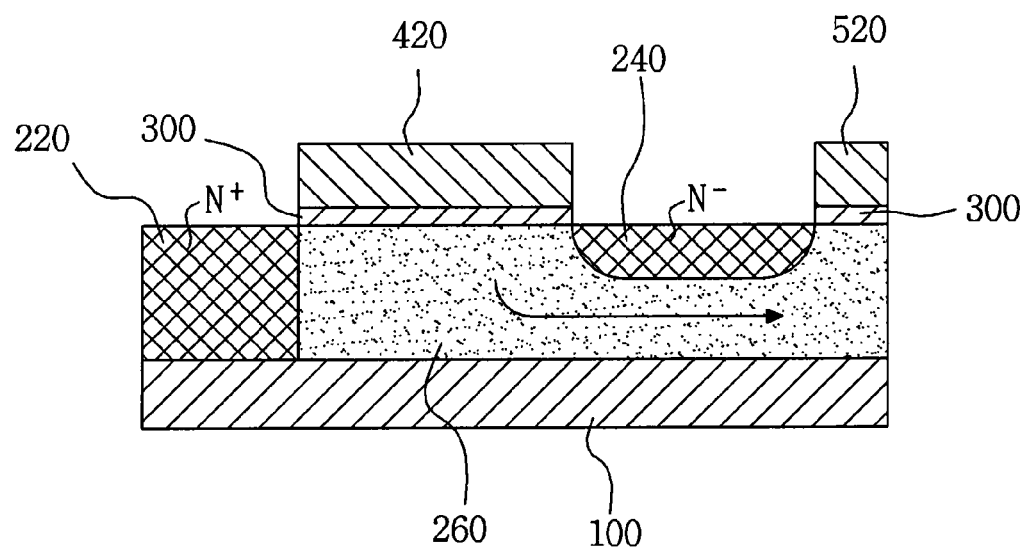

Referring to FIGS. 8a and 8b, according to some embodiments, a body biasing structure is formed in an SOI substrate by defining an active region and a field region, in which an active region is comprised of a body biasing contact region 600, a common active region 700 connected to the body biasing contact region, and one or more device active regions 800 connected vertically to the common active region, wherein device active regions are rectilinear with a predetermined width and interval; forming a first conducting layer (400: a common gate line of a selective transistor) on an insulating layer over both one part of the body biasing contact region 600 and one part of the common active region 700, and one or more second conducting layers (500: word line) each on an insulating layer over the device active region 800, wherein the first and second conducting layers are perpendicular to the device active region with an interval; and injecting P+, N+, and N− ions (FIG. 8a) using the first conducting layer 400 and the one or more second conducting layers 500 as a mask to form a source region 220, a common source/drain region 240 and a body region 260 (FIG. 8b).

Injecting N− ions makes a junction of the common source/drain region 240 shallow and therefore, it makes a conduction path under the common source/drain region. Through the conduction path, it is possible to body bias all memory cells (devices) formed on the device active region (800: B/L0, B/L1, B/L2 etc.) with only one body contact formed on the body biasing contact region 600.

It is preferable to choose a scaling of the line wide enough to retain a necessary margin to form a common gate line 400 because the necessity of a selective transistor is relatively smaller than a memory cell itself.

As mentioned above, body biasing is important in block erasing in a NAND type flash memory. During a block erase operation, a higher voltage than the gate voltage (word line) of the memory device is applied to a body biasing contact region 600. Therefore, a forward bias voltage is applied between a body biasing contact region 600 and a common source/drain region 240, a depletion layer cannot be formed, a conduction path can be formed under a common source/drain region 240, and body biasing is possible through this conduction path.

Figure 9A:
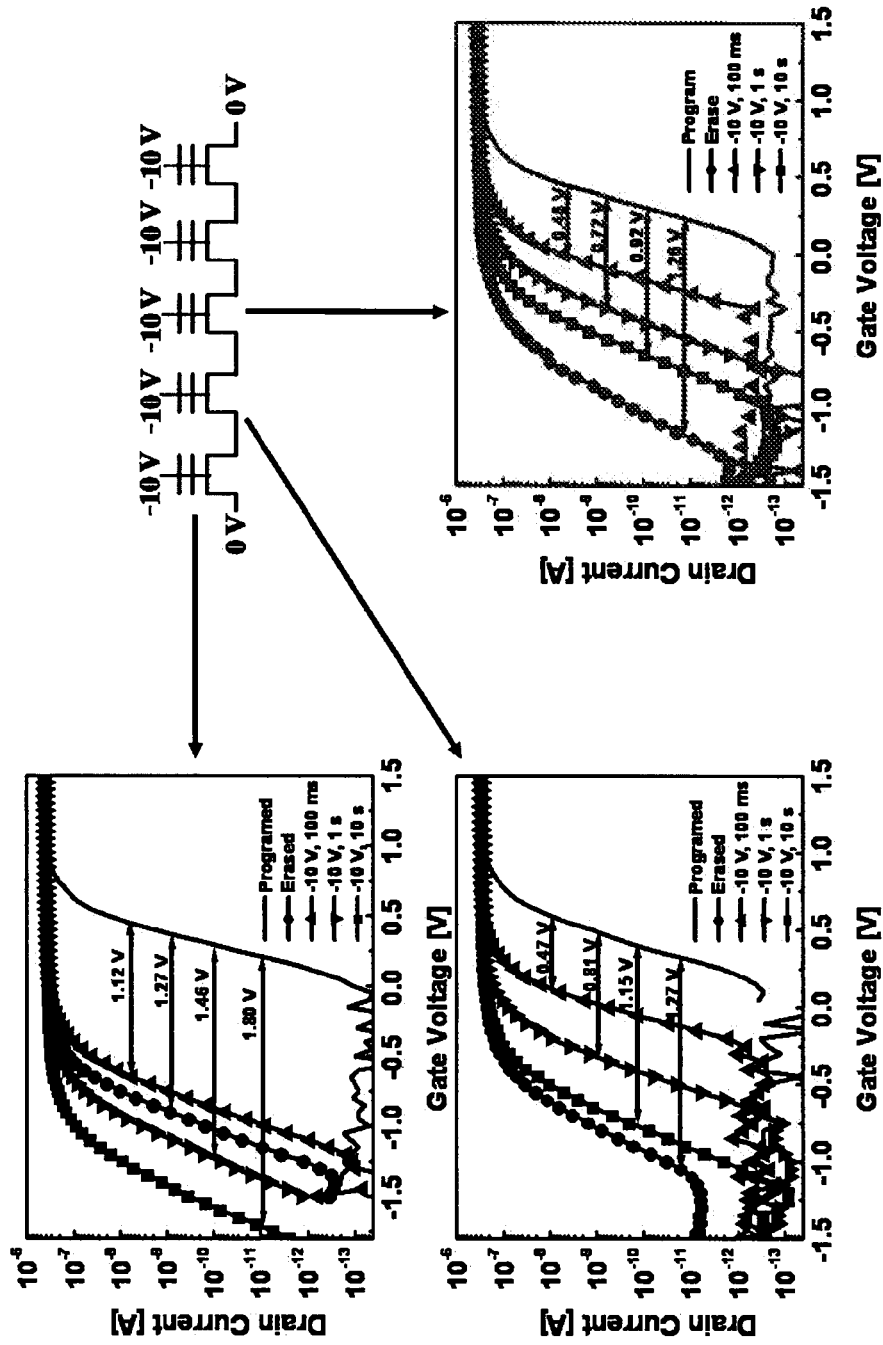
FIG. 9a illustrates the electrical characteristics of an erase operation when floating a body of a NAND type flash memory on a conventional SOI substrate.
Figure 9B:
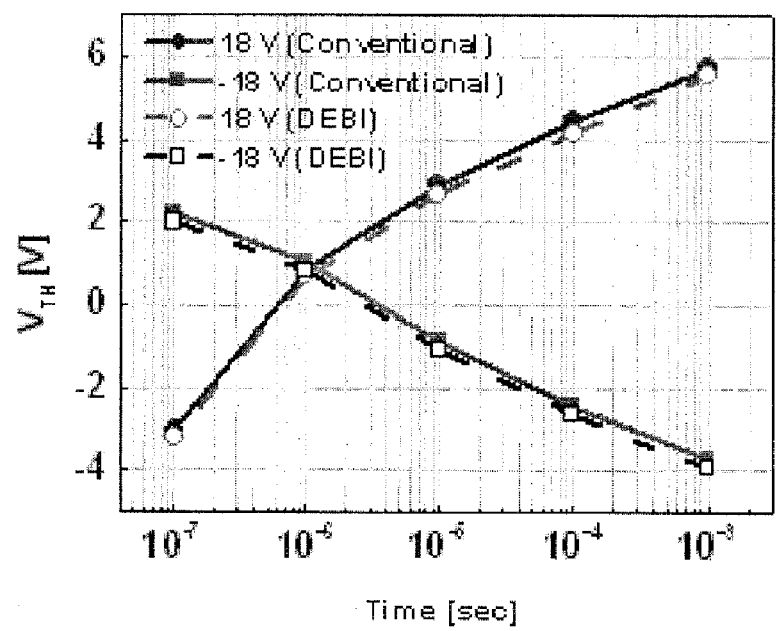
FIG. 9b illustrates the electrical characteristic of a program and erase operation in a structure according to some embodiments in comparison with a conventional bulk substrate.

FIG. 9a illustrates the electrical characteristics of an erase operation when floating a body of a NAND type flash memory on a conventional SOI substrate. FIG. 9b illustrates the electrical characteristic of a program and erase operation in a structure according to some embodiments in comparison with a conventional bulk substrate.

As shown in FIG. 9a, the electrical characteristics of an erase operation goes bad toward the middle of a memory array when the body of a NAND type flash memory on an SOI substrate is floated by a conventional structure. As shown in FIG. 9b, with a body biasing structure on an SOI substrate according to some embodiments, the floating body effect can be effectively eliminated providing similar electrical characteristics to a bulk substrate.

Some embodiments of the invention can suppress the floating body effect on an SOI substrate by making each junction of the common source/drain regions shallow in all sorts of series circuits of devices, which have a source/drain in common, and making it possible to body bias all devices with only one body biasing contact like a conventional bulk MOSFET.

What is claimed is:

1. A body biasing structure for Silicon-On-Insulator (SOI) devices comprising:
    an SOI substrate;
    an active region in the SOI substrate comprising:
        a body biasing contact region;
        a common active region connected to the body biasing contact region; and
        a device active region connected to the common active region;
    a first conducting layer, which is formed on an insulating layer over both one part of the body biasing contact region and one part of the common active region;
    a second conducting layer, which is formed on an insulating layer over the device active region;
    a source region, which is formed in the other part of the common active region, over which the first conducting layer is not formed;
    a common source/drain region, which is formed in the device active region between the first conducting layer and the second conducting layer; and
    a body region, which is formed in the active region, where the source region and the common source/drain region are not formed,
    wherein the common source/drain region has a shallow junction to enable the second conducting layer to body bias through a body contact, which is formed on the body biasing contact region.

2. The structure of claim 1, wherein the device active region is two or more rectilinear regions connected vertically to the common active region with a predetermined width.

3. The structure of claim 2 further including:
    a plurality of second conducting layers, which are each formed on an insulating layer over the device active region; and
    a plurality of common source/drain regions, which are formed in the device active region between the plurality of second conducting layers.

4. The structure of claim 2, wherein the two or more rectilinear regions are spaced apart by a predetermined interval.

5. The structure of claim 3, wherein the plurality of common source/drain regions have a shallow junction to enable the plurality of second conducting layers to body bias through the body contact, which is formed on the body biasing contact region.

6. The structure of claim 1 further including:
    a plurality of second conducting layers, which are each formed on an insulating layer over the device active region; and
    a plurality of common source/drain regions, which are formed in the device active region between the plurality of second conducting layers.

7. The structure of claim 6, wherein the plurality of common source/drain regions have a shallow junction to enable the plurality of second conducting layers to body bias through the body contact, which is formed on the body biasing contact region.

8. The structure of claim 1, wherein the first conducting layer is a common gate line and the second conducting layer is a word line.

9. A body biasing structure for Silicon-On-Insulator (SOI) devices comprising:
    an SOI substrate;
    an active region in the SOI substrate comprising:
        a body biasing contact region;
        a common active region connected to the body biasing contact region; and
        a device active region connected to the common active region;
    a first conducting layer, which is formed on an insulating layer over both one part of the body biasing contact region and one part of the common active region;
    a second conducting layer, which is formed on an insulating layer over the device active region;
    a source region, which is formed in the other part of the common active region, over which the first conducting layer is not formed;
    a common source/drain region, which is formed between the first conducting layer and the second conducting layer; and
    a body region, which is formed in the active region, where the source region and the common source/drain region are not formed,
    wherein SOI substrate comprises a buried oxide (BOX) layer, wherein the body region contacts the BOX layer and the insulating layers on which the first and second conducting layers are formed, and
    wherein the body region extends below the first conducting layer, the second conducting layer and the common source/drain region contiguously from body biasing contact region to a location vertically below the second conducting layer.

* * * * *

UNITED STATES PATENT AND TRADEMARK OFFICE
CERTIFICATE OF CORRECTION

| | |
|---|---|
| PATENT NO. | : 7,432,552 B2 |
| APPLICATION NO. | : 11/423696 |
| DATED | : October 7, 2008 |
| INVENTOR(S) | : Byung-Gook Park et al. |

It is certified that error appears in the above-identified patent and that said Letters Patent is hereby corrected as shown below:

Column 1, line 36, the word "11" should read -- 10 --;
Column 1, line 47, the word "MOSFFT" should read -- pMOSFET --.

Signed and Sealed this

Twenty-fourth Day of March, 2009

JOHN DOLL
*Acting Director of the United States Patent and Trademark Office*